United States Patent
Furuyama et al.

(10) Patent No.: US 11,999,648 B2
(45) Date of Patent: Jun. 4, 2024

(54) WAVELENGTH CONVERSION MEMBER AND LIGHT EMITTING DEVICE USING SAME

(71) Applicant: NIPPON ELECTRIC GLASS CO., LTD., Otsu (JP)

(72) Inventors: Tadahito Furuyama, Otsu (JP); Shotaro Fukumoto, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 947 days.

(21) Appl. No.: 16/977,117

(22) PCT Filed: Mar. 25, 2019

(86) PCT No.: PCT/JP2019/012474
§ 371 (c)(1),
(2) Date: Sep. 1, 2020

(87) PCT Pub. No.: WO2019/208057
PCT Pub. Date: Oct. 31, 2019

(65) Prior Publication Data
US 2020/0407269 A1   Dec. 31, 2020

(30) Foreign Application Priority Data
Apr. 25, 2018 (JP) .................. 2018-084012

(51) Int. Cl.
C03C 3/062 (2006.01)
C03C 3/068 (2006.01)
(Continued)

(52) U.S. Cl.
CPC ............ *C03C 14/006* (2013.01); *C03C 3/062* (2013.01); *C03C 3/068* (2013.01); *C03C 3/093* (2013.01);
(Continued)

(58) Field of Classification Search
CPC ... C03C 14/006; C03C 2214/16; C03C 3/062; C03C 3/068; C03C 3/093; C03C 3/095;
(Continued)

(56) References Cited

U.S. PATENT DOCUMENTS 5,998,925 A   12/1999  Shimizu et al.
6,069,440 A    5/2000  Shimizu et al.
(Continued)

FOREIGN PATENT DOCUMENTS

| CN | 101171205 A | 4/2008 |
|----|---|---|
| JP | 2000-208815 A | 7/2000 |

(Continued)

OTHER PUBLICATIONS

Official Communication issued in International Patent Application No. PCT/JP2019/012474, dated Jun. 18, 2019.
(Continued)

*Primary Examiner* — Mark Kopec
*Assistant Examiner* — Jaison P Thomas
(74) *Attorney, Agent, or Firm* — Keating & Bennett, LLP

(57) ABSTRACT

Provided is a wavelength conversion member which is made of a phosphor powder dispersed in a glass matrix and has an excellent luminous efficiency. A wavelength conversion member is comprising: a phosphor powder dispersed in a glass matrix, wherein the glass matrix has a refractive index (nd) of 1.6 or more and a liquidus temperature of 1070° C. or below.

9 Claims, 1 Drawing Sheet

(51) Int. Cl.
  *C03C 3/093* (2006.01)
  *C03C 3/095* (2006.01)
  *C03C 4/12* (2006.01)
  *C03C 14/00* (2006.01)
  *C09K 11/02* (2006.01)
  *F21V 9/30* (2018.01)

(52) U.S. Cl.
  CPC ............... *C03C 3/095* (2013.01); *C03C 4/12* (2013.01); *C09K 11/02* (2013.01); *F21V 9/30* (2018.02)

(58) Field of Classification Search
  CPC .. C03C 4/12; C03C 8/14; C09K 11/02; F21V 9/30; G02B 5/20; H01L 33/50; H01L 33/504; Y02B 20/00; F21Y 2115/10; F21Y 2115/30
  See application file for complete search history.

(56) References Cited

U.S. PATENT DOCUMENTS

| | | | |
|---|---|---|---|
| 2008/0030976 A1* | 2/2008 | Murazaki | C09K 11/02 362/84 |
| 2009/0314989 A1 | 12/2009 | Iwao et al. | |
| 2011/0198539 A1 | 8/2011 | Iwao et al. | |
| 2013/0230692 A1* | 9/2013 | Yanase | C03C 3/091 501/78 |
| 2016/0075592 A1* | 3/2016 | Nagashima | C09K 11/646 252/301.6 F |
| 2020/0381597 A1* | 12/2020 | Furuyama | H01L 33/504 |

FOREIGN PATENT DOCUMENTS

| | | |
|---|---|---|
| JP | 2003-258308 A | 9/2003 |
| JP | 4895541 B2 | 3/2012 |
| JP | 2015-027927 A | 2/2015 |
| JP | 2015-199640 A | 11/2015 |
| JP | 2016-028996 A | 3/2016 |
| JP | 2018-002492 A | 1/2018 |
| WO | 2014/106923 A1 | 7/2014 |
| WO | 2014/188920 A1 | 11/2014 |

OTHER PUBLICATIONS

Official Communication issued in corresponding Japanese Patent Application No. 2020-516119, dated May 24, 2023.
Official Communication issued in corresponding Chinese Patent Application No. 201980006504.5, dated Oct. 28, 2021.
Official Communication issued in corresponding Chinese Patent Application No. 201980006504.5, dated Jul. 20, 2022.

* cited by examiner

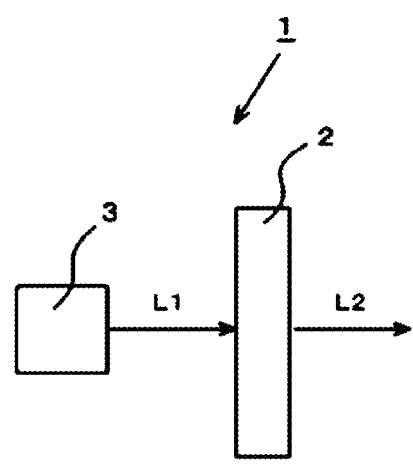

WAVELENGTH CONVERSION MEMBER AND LIGHT EMITTING DEVICE USING SAME

TECHNICAL FIELD

The present invention relates to wavelength conversion members for converting the wavelength of light emitted from light emitting diodes (LEDs), laser diodes (LDs) or the like to another wavelength and light emitting devices using the wavelength conversion members.

BACKGROUND ART

Recently, attention has been increasingly focused on light emitting devices using LEDs, LDs or like excitation light sources as next-generation light emitting devices to replace fluorescence lamps and incandescent lamps, from the viewpoint of their low power consumption, small size, light weight, and easy adjustment to light intensity. For example, Patent Literature 1 discloses, as an example of such a next-generation light emitting device, a light emitting device in which a wavelength conversion member is disposed on an LED capable of emitting a blue light and absorbs part of the light from the LED to convert it to a yellow light. This light emitting device emits a white light which is a synthetic light of the blue light emitted from the LED and the yellow light emitted from the wavelength conversion member.

As a wavelength conversion member, there is conventionally used a wavelength conversion member in which a phosphor powder is dispersed in a resin matrix. However, when such a wavelength conversion member is used, there arises a problem that the resin is degraded by light from the excitation light source to make it likely that the luminance of the light emitting device will be low. Particularly, the wavelength conversion member has a problem that the molded resin is degraded by heat and high-energy short-wavelength (blue to ultraviolet) light emitted from the excitation light source to cause discoloration or deformation.

To cope with the above, there are proposed wavelength conversion members formed of a fully inorganic solid in which a phosphor powder is dispersed and set in, instead of the resin matrix, a glass matrix (see, for example, Patent Literatures 2 and 3). These wavelength conversion members have the feature that glass as the matrix is less likely to be degraded by heat and irradiation light from the LED and therefore less likely to cause problems of discoloration and deformation.

CITATION LIST

Patent Literature

[PTL 1]
JP-A-2000-208815
[PTL 2]
JP-A-2003-258308
[PTL 3]
JP-B2-4895541

SUMMARY OF INVENTION

Technical Problem

In order to increase the luminous efficiency of a wavelength conversion member, it is important to efficiently extract fluorescence produced in the wavelength conversion member to the outside. For this purpose, there is known a technique for reducing the thickness of the wavelength conversion member to increase the density of phosphor powder, thus reducing the absorption loss of light due to the glass matrix. However, when the density of phosphor powder mixed is increased, internal scattering of excitation light and fluorescence tends to increase, thus reducing the luminous efficiency. Also when the softening point of the glass matrix is lowered in order to seal the phosphor powder which is weak against heat, internal scattering of excitation light and fluorescence tends to increase, thus reducing the luminous efficiency.

In view of the foregoing, the present invention has an object of providing a wavelength conversion member which is made of a phosphor powder dispersed in a glass matrix and has an excellent luminous efficiency.

Solution to Problem

A wavelength conversion member according to the present invention is a wavelength conversion member comprising: a phosphor powder dispersed in a glass matrix, wherein the glass matrix has a refractive index (nd) of 1.6 or more and a liquidus temperature of 1070° C. or below. Most phosphor powders for use in wavelength conversion members generally have high refractive indices. When the density of phosphor powder mixed in such a wavelength conversion member is increased, the wavelength conversion member tends to increase internal scattering due to a refractive index difference of the phosphor powder from the glass matrix to thus decrease the luminous efficiency. To cope with this, when the glass matrix has a high refractive index as described above, the refractive index difference from the phosphor powder is narrowed, so that internal scattering can be reduced. Furthermore, when the softening point of the glass matrix is lowered, the glass matrix is likely to devitrify during firing, so that the luminous efficiency of the wavelength conversion member tends to decrease because of scattering due to a refractive index difference between precipitated crystals (devitrified products) and the glass matrix. Since in the present invention the glass matrix has a low liquidus temperature (has a high liquidus viscosity) as described above, devitrification during firing can be reduced, so that internal scattering can be reduced. From those described above, it is possible to provide a wavelength conversion member having an excellent luminous efficiency.

In the wavelength conversion member according to the present invention, the glass matrix preferably contains, in terms of % by mass, 25 to 50% $SiO_2$, 0.1 to 8% $Al_2O_3$, over 0 to 15% $B_2O_3$, 0 to 10% MgO, 0 to 15% CaO, 0 to 15% SrO, 0.1 to 50% BaO, 0 to 20% ZnO, 0 to 10% $ZrO_2$, 0 to 5% $Nb_2O_5$, 2.1 to 15% $TiO_2$, and 0.1 to 15% $La_2O_3$ and $(TiO_2+La_2O_3)/B_2O_3$ is 0.5 or more. In the case of this composition, a wavelength conversion member having desired properties described above can be easily obtained. Specifically, since the glass matrix contains $TiO_2$ and $La_2O_3$ in predetermined amounts described above, its refractive index can be increased. Furthermore, since the contents of $TiO_2$, $La_2O_3$, and $B_2O_3$ are optimized as described above, a glass having excellent devitrification resistance can be obtained. The term "$(TiO_2+La_2O_3)/B_2O_3$" means the value of the total content of $TiO_2$ and $La_2O_3$ divided by the content of $B_2O_3$.

In the wavelength conversion member according to the present invention, a content of $Li_2O+Na_2O+K_2O$ in the glass matrix is preferably 0 to 5%. Thus, the devitrification resistance of the glass matrix can be increased. The term "$Li_2O+Na_2O+K_2O$" means the total content of $Li_2O$, $Na_2O$, and $K_2O$.

In the wavelength conversion member according to the present invention, a content of $Sb_2O_3$ in the glass matrix is preferably below 0.2%.

In the wavelength conversion member according to the present invention, the phosphor powder is preferably at least one selected from the group consisting of a nitride phosphor, an oxynitride phosphor, an oxide phosphor, a sulfide phosphor, an oxysulfide phosphor, a halide phosphor, and an aluminate phosphor.

The wavelength conversion member according to the present invention preferably contains the phosphor powder in an amount of 0.01 to 70% by volume.

The wavelength conversion member according to the present invention is preferably made of a sintered body of a mixture containing a glass powder and the phosphor powder. Thus, the phosphor powder can be easily uniformly dispersed into the glass matrix, so that light emitted from the wavelength conversion member is likely to become homogeneous.

A light emitting device according to the present invention comprises the above-described wavelength conversion member and a light source operable to irradiate the wavelength conversion member with excitation light.

Advantageous Effects of Invention

The present invention enables provision of a wavelength conversion member which is made of a phosphor powder dispersed in a glass matrix and has an excellent luminous efficiency.

BRIEF DESCRIPTION OF DRAWINGS

FIG. 1 is a schematic view showing a wavelength conversion member according to an embodiment of the present invention.

DESCRIPTION OF EMBODIMENTS

A wavelength conversion member according to the present invention is made of a phosphor powder dispersed in a glass matrix.

The refractive index (nd) of the glass matrix is 1.6 or more, preferably 1.64 or more, more preferably 1.65 or more, still more preferably 1.67 or more, yet still more preferably 1.68 or more, even yet still more preferably 1.69 or more, and particularly preferably 1.7 or more. If the refractive index of the glass matrix is too low, internal scattering due to a refractive index difference between the glass matrix and the phosphor powder becomes large, so that the luminous efficiency of the wavelength conversion member tends to decrease. On the other hand, if the refractive index of the glass matrix is too high, internal scattering due to a refractive index difference between the glass matrix and the phosphor powder becomes large rather than becomes small. Therefore, the refractive index of the glass matrix is preferably not more than 2.2, more preferably not more than 2.1, still more preferably not more than 2, and particularly preferably not more than 1.9. In order to increase the refractive index, the glass matrix may contain an alkaline earth metal oxide (MgO, CaO, SrO or BaO), $ZrO_2$, $Nb_2O_5$, $TiO_2$, $La_2O_3$ or like components. Alternatively, the upper limit of components having a tendency to decrease the refractive index, such as $SiO_2$, $Al_2O_3$, and $B_2O_3$, may be restricted.

The liquidus temperature (TL) of the glass matrix is 1070° C. or below, preferably 1060° C. or below, more preferably 1040° C. or below, even more preferably 1020° C. or below, still more preferably 1000° C. or below, yet still more preferably 980° C. or below, even yet still more preferably 960° C. or below, and particularly preferably 940° C. or below. If the liquidus temperature is too high, the glass matrix is likely to devitrify during firing, so that the luminous efficiency tends to decrease because of scattering caused by a refractive index difference between precipitated crystals and the glass matrix. The lower limit of the liquidus temperature is not particularly limited, but is realistically not lower than 700° C. and preferably not lower than 800° C. In order to lower the liquidus temperature, $Al_2O_3$, $B_2O_3$, ZnO, $ZrO_2$ or the like may be incorporated into the glass matrix. Alternatively, $(TiO_2+La_2O_3)/B_2O_3$ may be appropriately adjusted.

The composition of the glass matrix is preferably selected to have the above-described properties and, for example, the glass matrix contains, in terms of % by mass, 25 to 50% $SiO_2$, 0.1 to 8% $Al_2O_3$, over 0 to 15% $B_2O_3$, 0 to 10% MgO, 0 to 15% CaO, 0 to 15% SrO, 0.1 to 50% BaO, 0 to 20% ZnO, 0 to 10% $ZrO_2$, 0 to 5% $Nb_2O_5$, 2.1 to 15% $TiO_2$, and 0.1 to 15% $La_2O_3$, $(TiO_2+La_2O_3)/B_2O_3$ being 0.5 or more. Reasons why the glass composition is limited as above will be described below. In the following description of the content of each component, "%" refers to "% by mass" unless otherwise stated.

$SiO_2$ is a component that forms the glass network. If the content of $SiO_2$ is small, the glass network becomes difficult to form, so that vitrification tends to be difficult. Furthermore, the chemical resistance tends to decrease. A wavelength conversion member may be acid-washed after being processed. If in this case the chemical resistance of the glass matrix is low, the glass matrix may become modified to decrease the luminous efficiency. Therefore, the content of $SiO_2$ is preferably 25% or more and particularly preferably 30% or more. On the other hand, if the content of $SiO_2$ is large, the refractive index may be likely to decrease and the meltability may be likely to deteriorate. Therefore, the content of $SiO_2$ is preferably 50% or less, more preferably 48% or less, still more preferably 45% or less, and particularly preferably 40% or less.

$Al_2O_3$ is a component that stabilizes the component balance of the glass composition to contribute to improvement in devitrification resistance. However, if its content is too large, the liquidus temperature of the glass matrix rises, so that the glass matrix is likely to devitrify during melting and firing. Furthermore, the refractive index is likely to decrease. Therefore, the content of $Al_2O_3$ is preferably 8% or less, more preferably 6% or less, and particularly preferably 5% or less. On the other hand, for the purpose of achieving the above effect, the content of $Al_2O_3$ is preferably 0.1% or more, more preferably 0.5% or more, and particularly preferably 1% or more.

$B_2O_3$ is a component that lowers the liquidus temperature to increase the devitrification resistance. However, if its content is too large, the refractive index is likely to decrease. Furthermore, the strain point is likely to decrease. If the strain point of the glass matrix decreases, the thermal resistance of the glass decreases, so that the wavelength conversion member may be softened and deformed by heat upon irradiation with excitation light. Therefore, the content of $B_2O_3$ is preferably 15% or less, more preferably 10% or less, and particularly preferably 8% or less. On the other hand, for the purpose of achieving the above effect, the content of $B_2O_3$ is preferably over 0%, more preferably 1% or more, still more preferably 2% or more, and particularly preferably 5% or more.

MgO is a component that raises the refractive index. Furthermore, MgO has the effect of improving the meltability. However, if its content is too large, the glass matrix lacks the balance of the glass composition, so that it is likely to deteriorate the devitrification resistance or likely to be phase-separated. Therefore, the content of MgO is preferably 10% or less, more preferably 8% or less, still more preferably 6% or less, and yet still more preferably 3%. On the other hand, for the purpose of achieving the above effects, the content of MgO is preferably 0.1% or more and particularly preferably 0.5% or more.

CaO is a component that raises the refractive index. Furthermore, CaO has the effect of improving the meltability. However, if its content is too large, the glass matrix lacks the balance of the glass composition, so that it is likely to deteriorate the devitrification resistance. Therefore, the content of CaO is preferably 15% or less and particularly preferably 10% or less. On the other hand, for the purpose of achieving the above effects, the content of CaO is preferably 1% or more, more preferably 2% or more, still more preferably 3% or more, and particularly preferably 5% or more.

SrO is a component that raises the refractive index. Furthermore, SrO has the effect of improving the meltability. However, if its content is too large, the glass matrix lacks the balance of the glass composition, so that it is likely to deteriorate the devitrification resistance. Therefore, the content of SrO is preferably 15% or less, more preferably 12% or less, even more preferably 10% or less, still more preferably 9% or less, yet still more preferably 8% or less, even yet still more preferably 7% or less, and particularly preferably 6% or less. On the other hand, in order to achieve the above effects, the content of SrO is preferably 0.5% or more, more preferably 1% or more, still more preferably 2% or more, yet still more preferably 3% or more, and particularly preferably 3.5% or more.

BaO is, among alkaline earth metal oxides, a component having a high effect of raising the refractive index. However, if its content is too large, the glass matrix lacks the balance of the glass composition, so that it is likely to deteriorate the devitrification resistance. Therefore, the content of BaO is preferably 50% or less, more preferably 40% or less, still more preferably 35% or less, and particularly preferably 30% or less. On the other hand, for the purpose of achieving the above effects, the content of BaO is preferably 0.1% or more, more preferably 10% or more, still more preferably 20% or more, yet still more preferably 22% or more, and particularly preferably 25% or more.

ZnO is a component that improves the devitrification resistance. However, if its content is too large, the glass matrix lacks the balance of the glass composition, so that it is likely to deteriorate the devitrification resistance and the chemical resistance. Therefore, the content of ZnO is preferably 30% or less, 20% or less, 15% or less, 10% or less, 5% or less, or 2% or less, and the glass matrix is more preferably substantially free from ZnO. As used herein, "substantially free from" means that the glass matrix does not deliberately contain the relevant component and is not intended to exclude unavoidable incorporation of impurities. Objectively, this means that the content of the relevant component is less than 0.1%.

$ZrO_2$ is a component that raises the refractive index and increases the devitrification resistance and the chemical resistance. However, if its content is too large, the glass matrix is likely to deteriorate the devitrification resistance. Therefore, the content of $ZrO_2$ is preferably 10% or less, more preferably 8% or less, still more preferably 5% or less, and particularly preferably 3% or less. The lower limit of the content of $ZrO2$ is not particularly limited and may be 0%, but, in order to achieve the above effects, the content of $ZrO_2$ is preferably 0.1% or more, more preferably 1% or more, and particularly preferably 2% or more.

$Nb_2O_5$ is a component that raises the refractive index. However, if its content is too large, the glass matrix is likely to deteriorate the devitrification resistance and decrease the visible light transmittance. Furthermore, the raw material cost is likely to rise. Therefore, the content of $Nb_2O_5$ is preferably 5% or less, 3% or less, or 1% or less, and the glass matrix is more preferably substantially free from $Nb_2O_5$.

$TiO_2$ is a component that raises the refractive index and increases the chemical resistance. However, if its content is too large, the glass matrix is likely to deteriorate the devitrification resistance. Therefore, the content of $TiO_2$ is preferably 15% or less, more preferably 13% or less, and particularly preferably 11% or less. On the other hand, for the purpose of achieving the above effects, the content of $TiO2$ is preferably 1% or more, more preferably 2.1% or more, still more preferably 3% or more, and particularly preferably 5% or more.

$La_2O_3$ is a component that increases the refractive index and the chemical resistance. However, if its content is too large, the glass matrix is likely to deteriorate the devitrification resistance. Therefore, the content of $La_2O_3$ is preferably 25% or less, more preferably 15% or less, still more preferably 14% or less, yet still more preferably 13% or less, even yet still more preferably 12% or less, and particularly preferably 10% or less. On the other hand, in order to achieve the above effects, the content of $La_2O_3$ is preferably 0.1% or more, more preferably 1% or more, still more preferably 2.5% or more, yet still more preferably 3% or more, even yet still more preferably 5% or more, and particularly preferably 7% or more.

When $(TiO_2+La_2O_3)/B_2O_3$ is appropriately adjusted, the devitrification resistance and the chemical resistance can be balanced. $(TiO_2+La_2O_3)/B_2O_3$ is preferably 0.5 or more, more preferably 1 or more, and particularly preferably 1.5 or more. If $(TiO_2+La_2O_3)/B_2O_3$ is too small, the glass matrix is likely to deteriorate the chemical resistance. Furthermore, the glass matrix is likely to decrease the refractive index. The upper limit of $(TiO_2+La_2O_3)/B_2O_3$ is not particularly limited. However, if its value is too large, the glass matrix tends to decrease the liquidus viscosity to have a strong tendency toward devitrification. Therefore, $(TiO_2+La_2O_3)/B_2O_3$ is preferably 6 or less, more preferably 4 or less, still more preferably 3.5 or less, and particularly preferably 3 or less.

$Li_2O$, $Na_2O$, and $K_2O$ are components that increase the tendency for the glass matrix to devitrify. Therefore, the content of $Li_2O+Na_2O+K_2O$ is preferably 5% or less, more preferably 3% or less, and still more preferably 1% or less, and the glass matrix is particularly preferably substantially free from these components. The content of each of $Li_2O$, $Na_2O$, and $K_2O$ is preferably 5% or less, more preferably 3% or less, and still more preferably 1% or less, and the glass matrix is particularly preferably substantially free from the component.

$Sb_2O_3$ is a component that functions as a fining agent, but is a substance of environmental concern. Therefore, its content is preferably less than 0.2% and the glass matrix is particularly preferably substantially free from $Sb_2O_3$.

Apart from $Sb_2O_3$, one or more selected from the group consisting of $As_2O_3$, $CeO_2$, $SnO_2$, F, Cl, and $SO_3$ may be added in a total amount of 0 to 3% as a fining agent to the glass matrix. However, from an environmental perspective, $As_2O_3$ and F, particularly $As_2O_3$, is preferably kept from being used as much as possible and the glass matrix is more preferably substantially free from these components. From the environmental perspective, $SnO_2$, $SO_3$ or Cl is preferably used. The content of $SnO_2$ is preferably 0 to 1%, more preferably 0.01 to 0.5%, and particularly preferably 0.05 to 0.4%. Furthermore, the content of $SnO_2+SO_3+Cl$ is preferably 0 to 1%, more preferably 0.001 to 1%, still more preferably 0.01 to 0.5%, and particularly preferably 0.01 to 0.3%. As used herein, "$SnO_2+SO_3+Cl$" refers to the total content of $SnO_2$, $SO_3$, and Cl.

PbO is a component that raises the refractive index, but the glass matrix is preferably substantially free from PbO from the environmental perspective.

$Ta_2O_5$, $Gd_2O_3$, $Y_2O_3$, and $Yb_2O_3$ are components that raise the refractive index, but are rare materials, which leads to a rise in raw material cost. Therefore, the content of each of these materials is preferably 5% or less, more preferably 3% or less, and still more preferably 1% or less, and the glass matrix is particularly preferably substantially free from these materials.

$WO_3$ is a component that raises the refractive index, but is likely to significantly precipitate devitrified products during glass molding and so on and decrease the visible light transmittance, particularly, in a short-wavelength region. Therefore, its content is preferably 5% or less, more preferably 3% or less, and still more preferably 1% or less, and the glass matrix is particularly preferably substantially free from $WO_3$.

$TeO_2$ is a component that largely extends the vitrification range to significantly reduce the precipitation of devitrified products and raise the refractive index. However, $TeO_2$ is a rare material, which leads to a rise in raw material cost. Therefore, its content is preferably 5% or less, more preferably 3% or less, and still more preferably 1% or less, and the glass matrix is particularly preferably substantially free from $TeO_2$.

$Bi_2O_3$ is a component that raises the refractive index, but is likely to decrease the visible light transmittance. Furthermore, $Bi_2O_3$ is a rare material, which leads to a rise in raw material cost. Therefore, the glass matrix is preferably substantially free from $Bi_2O_3$.

$GeO_2$ has the effects of increasing the stability of vitrification and raising the refractive index. However, $GeO_2$ is a rare material, which leads to a rise in raw material cost. Therefore, the glass matrix is preferably substantially free from $GeO_2$.

$HfO_2$ is a component that raises the refractive index, but is a rare material, which leads to a rise in raw material cost. Therefore, the glass matrix is preferably substantially free from $HfO_2$.

The strain point of the glass matrix is preferably 600° C. or above and particularly preferably 620° C. or above. A higher strain point of the glass is more preferred because the thermal resistance becomes higher.

The wavelength conversion member according to the present invention is, for example, made of a sintered body of a mixture containing a glass powder and a phosphor powder. Regarding the particle size of the glass powder, for example, its maximum particle diameter $D_{max}$ is preferably 200 μm or less (particularly 150 μm or less and more preferably 105 μm or less) and its average particle diameter $D_{50}$ is preferably 0.1 μm or more (particularly 1 μm or more and more preferably 2 μm or more). If the maximum particle diameter $D_{max}$ of the glass powder is too large, the dispersed state of the phosphor powder becomes poor, so that the luminescent color is likely to vary. Furthermore, if the average particle diameter $D_{50}$ is too small, excitation light excessively scatters in the inside of the wavelength conversion member, so that the luminous efficiency is likely to decrease.

In the present invention, the maximum particle diameter $D_{max}$ and the average particle diameter $D_{50}$ refer to respective values measured by laser diffractometry.

There is no particular limitation as to the type of phosphor powder that can be used in the present invention, so long as it is generally available in the market. Examples of the phosphor powder include a nitride phosphor, an oxynitride phosphor, an oxide phosphor (inclusive of a garnet-based phosphor, such as YAG phosphor), a sulfide phosphor, an oxysulfide phosphor, a halide phosphor (such as a halophosphoric acid chloride), and an aluminate phosphor. These phosphor powders may be used singly or in a mixture of two or more of them. Of these phosphor powders, the nitride phosphor, the oxynitride phosphor, and the oxide phosphor are preferred because they have high thermal resistance and are therefore relatively less likely to degrade during firing. The nitride phosphor and the oxynitride phosphor have the feature that they convert near-ultraviolet to blue excitation light to a wide wavelength range of green to red light and additionally have relatively high luminescence intensity. Therefore, the nitride phosphor and the oxynitride phosphor are effective as a phosphor powder for use in a wavelength conversion member for a white LED device.

Examples of the above phosphor powder include those having an excitation band in a wavelength range of 300 to 500 nm and a luminescence peak at a wavelength of 380 to 780 nm and include, particularly, those producing luminescence in blue (with wavelengths of 440 to 480 nm), those producing luminescence in green (with wavelengths of 500 to 540 nm), those producing luminescence in yellow (with wavelengths of 540 to 595 nm), and those producing luminescence in red (with wavelengths of 600 to 700 nm). A plurality of types of phosphor powders may be used in mixture according to the wavelength range of excitation light or luminescence. For example, in providing a white light by irradiation with excitation light in the ultraviolet region, respective types of phosphor powders that produce blue, green, yellow, and red fluorescences may be used in mixture.

When a mixture (wavelength conversion material) containing the glass powder and the phosphor powder is fired near the softening point of the glass powder, a wavelength conversion member can be obtained. The firing is preferably performed in a reduced-pressure atmosphere. Specifically, the firing is preferably performed in a reduced-pressure atmosphere of less than $1.013 \times 10^5$ Pa, more preferably in a reduced-pressure atmosphere of 1000 Pa or less, and particularly preferably in a reduced-pressure atmosphere of 400 Pa or less. Thus, the amount of air bubbles remaining in the wavelength conversion member can be reduced. As a result, the scattering factor due to air bubbles in the wavelength conversion member can be reduced, so that the luminous efficiency can be increased. The whole firing process may be performed in a reduced-pressure atmosphere or only the temperature increasing step thereof may be performed in a reduced-pressure atmosphere and the temperature holding and temperature decreasing steps before and after the temperature increasing step may be performed in an atmosphere other than the reduced-pressure atmosphere (for example, under an atmospheric pressure).

The luminous efficiency (lm/W) of the wavelength conversion member varies depending on the type, content, and particle diameter of the phosphor powder, the thickness of the wavelength conversion member, and so on. The content of the phosphor powder and the thickness of the wavelength conversion member may be appropriately adjusted so that the luminous efficiency becomes optimal. If the content of the phosphor powder is too large, the wavelength conversion member may have problems, such as: it is less likely to be sintered; it has a large porosity to thus make it less likely that the phosphor powder is efficiently irradiated with excitation light; and the mechanical strength of the wavelength conversion member is likely to decrease. On the other hand, if the content of the phosphor powder is too small, desired chromaticity and luminescence intensity are difficult to achieve. From these perspectives, the content of the phosphor powder in the wavelength conversion member according to the present invention is adjusted, in terms of % by volume, preferably in a range of 0.01 to 70%, more preferably in a range of 2 to 50%, and still more preferably in a range of 3 to 30%.

The above does not apply to a reflective wavelength conversion member aimed at reflecting fluorescence generated in the wavelength conversion member toward the excitation light incident side thereof so that only the fluorescence is mainly extracted to the outside, and the content of the phosphor powder may be larger (for example, in terms of % by volume, 30 to 80% or 40 to 75%) so that the luminescence intensity is maximized.

The wavelength conversion member according to the present invention may contain, in addition to the glass and phosphor powders, a filler, such as alumina and/or magnesia, in a total amount of up to 50% by mass for the purpose of improving heat dissipation and/or other purposes. The average particle diameter $D_{50}$ of the filler is preferably 0.1 to 50 μm, more preferably 0.3 to 30 μm, still more preferably 0.5 to 20 μm, and particularly preferably 1 to 10 μm. If the average particle diameter $D_{50}$ of the filler is too large, the dispersibility thereof in the wavelength conversion member decreases, so that the color unevenness is likely to occur. On the other hand, if the average particle diameter $D_{50}$ of the filler is too small, the contact between filler particles reduces or the distance between filler particles increases, so that the effect of improving heat dissipation is less likely to be sufficiently achieved.

The difference in refractive index (nd) between the filler and the glass matrix is, in terms of absolute value, preferably 1.0 or less, more preferably 0.8 or less, still more preferably 0.5 or less, and particularly preferably 0.3 or less. Thus, internal scattering due to a refractive index difference between the filler and the glass matrix can be reduced, so that the decrease in luminescence intensity can be reduced.

There is no particular limitation as to the shape of the wavelength conversion member according to the present invention and examples include not only members having specific shapes of their own, such as platy, columnar, hemispheric, spheric, and hemispheric dome shapes, but also film-like sintered bodies formed on surfaces of base materials, including a glass substrate and a ceramic substrate.

FIG. 1 shows an embodiment of a light emitting device according to the present invention. As shown in FIG. 1, the light emitting device 1 includes a wavelength conversion member 2 and a light source 2. The light source 3 is operable to irradiate the wavelength conversion member 2 with excitation light. The excitation light L1 having entered the wavelength conversion member 2 is converted to light L2 having another wavelength and exits from the opposite side of the wavelength conversion member 2 to the light source 3. At this time, synthesized light of the light L2 obtained by the wavelength conversion and the excitation light L1 having not been converted in wavelength and having passed through the wavelength conversion member may be emitted.

Examples

Hereinafter, the present invention will be described in detail with reference to examples, but the present invention is not limited to these examples.

Tables 1 to 3 show working examples (sample Nos. 1 to 23) and comparative examples (sample Nos. 24 to 26).

TABLE 1

| | 1 | 2 | 3 | 4 | 5 | 6 | 7 | 8 | 9 | 10 |
|---|---|---|---|---|---|---|---|---|---|---|
| $SiO_2$ | 35.5 | 37.6 | 37.6 | 33.6 | 34.5 | 32.5 | 32.5 | 31.5 | 31.5 | 33.5 |
| $Al_2O_3$ | 1.5 | 4.5 | 1.5 | 1.5 | 1.5 | 1.5 | 3.5 | 3.5 | 3.5 | 3.5 |
| $B_2O_3$ | 7.4 | 4.4 | 6.4 | 5.4 | 7.4 | 7.4 | 7.4 | 7.4 | 7.4 | 7.4 |
| MgO | | | | | 0.5 | 0.5 | 0.5 | 0.5 | 0.5 | |
| CaO | 5.9 | 5.9 | 5.9 | 9.9 | 5.4 | 5.4 | 5.4 | 5.4 | 5.4 | 5.9 |
| SrO | 4.9 | 4.9 | 4.9 | 4.9 | 4.9 | 4.9 | 4.9 | 4.9 | 4.9 | 4.9 |
| BaO | 27.0 | 23.0 | 27.0 | 27.0 | 27.0 | 27.0 | 27.0 | 27.0 | 27.0 | 27.0 |
| ZnO | | | | | | | | | | |
| $TiO_2$ | 5.7 | 6.7 | 3.7 | 5.7 | 8.7 | 9.7 | 6.7 | 7.7 | 8.7 | 8.7 |
| $ZrO_2$ | 2.2 | 3.2 | 3.2 | 2.2 | 2.2 | 2.2 | 2.2 | 2.2 | 2.2 | 2.2 |
| $La_2O_3$ | 9.8 | 9.8 | 9.8 | 9.8 | 7.8 | 8.8 | 9.8 | 9.8 | 8.8 | 6.8 |
| $Sb_2O_3$ | 0.1 | | | | 0.1 | 0.1 | 0.1 | 0.1 | 0.1 | 0.1 |
| $SnO_2$ | | | | | | | | | | |
| $Gd_2O_3$ | | | | | | | | | | |
| $(TiO_2 + La_2O_3)/B_2O_3$ | 2.1 | 3.8 | 2.1 | 2.9 | 2.2 | 2.5 | 2.2 | 2.4 | 2.4 | 2.1 |
| Refractive Index nd | 1.67 | 1.67 | 1.66 | 1.69 | 1.69 | 1.7 | 1.68 | 1.69 | 1.69 | 1.68 |
| Strain Point Ts (° C.) | 646 | 664 | 649 | 651 | 645 | 644 | 640 | 640 | 641 | 640 |
| Liquidus Temperature TL (° C.) | 889 | 1030 | 945 | 995 | 928 | 940 | 965 | 950 | 950 | 960 |
| Chemical Resistance (μm) | 0.1 | 0.1 | 0.1 | — | — | — | — | — | — | — |
| Inorganic Phosphor | | | | | YAG | | | | | |
| Content of Phosphor Powder (% by volume) | | | | | 10 | | | | | |

TABLE 1-continued

|  | 1 | 2 | 3 | 4 | 5 | 6 | 7 | 8 | 9 | 10 |
|---|---|---|---|---|---|---|---|---|---|---|
| Refractive Index of Glass Matrix | 1.67 | 1.67 | 1.66 | 1.69 | 1.69 | 1.7 | 1.68 | 1.69 | 1.69 | 1.68 |
| Refractive Index of Phosphor Powder | | | | | 1.82 | | | | | |
| Refractive Index Difference between Glass Matrix and Phosphor Powder | 0.15 | 0.15 | 0.16 | 0.13 | 0.13 | 0.12 | 0.14 | 0.13 | 0.13 | 0.14 |
| Firing Temperature (° C.) | 789 | 930 | 845 | 895 | 828 | 840 | 865 | 850 | 850 | 860 |
| Luminous Flux (lm) | 201 | 202 | 198 | 205 | 195 | 208 | 199 | 200 | 200 | 201 |

TABLE 2

|  | 11 | 12 | 13 | 14 | 15 | 16 | 17 | 18 | 19 | 20 |
|---|---|---|---|---|---|---|---|---|---|---|
| $SiO_2$ | 31.5 | 30.5 | 30.5 | 32.5 | 30.5 | 31.5 | 32.5 | 31.5 | 33.5 | 32.5 |
| $Al_2O_3$ | 3.5 | 3.5 | 4.5 | 3.5 | 3.5 | 4.5 | 4.5 | 3.5 | 2.5 | 2.5 |
| $B_2O_3$ | 7.4 | 7.4 | 7.4 | 7.4 | 7.4 | 7.4 | 7.4 | 7.4 | 7.4 | 7.4 |
| MgO | | | | | | | | | | |
| CaO | 5.9 | 5.9 | 2.9 | 2.9 | 2.9 | 2.9 | 2.9 | 2.9 | 2.9 | 2.9 |
| SrO | 4.9 | 4.9 | 7.9 | 7.9 | 7.9 | 7.9 | 7.9 | 7.9 | 7.9 | 7.9 |
| BaO | 27.0 | 27.0 | 27.0 | 27.0 | 27.0 | 27.0 | 27.0 | 27.0 | 27.0 | 27.0 |
| ZnO | | | | | | | | | | |
| $TiO_2$ | 7.7 | 6.7 | 6.7 | 6.7 | 7.7 | 5.7 | 5.7 | 5.7 | 5.7 | 6.7 |
| $ZrO_2$ | 2.2 | 2.2 | 2.2 | 2.2 | 2.2 | 2.2 | 2.2 | 2.2 | 2.2 | 2.2 |
| $La_2O_3$ | 9.8 | 11.8 | 10.8 | 9.8 | 10.8 | 10.8 | 9.8 | 11.8 | 10.8 | 10.8 |
| $Sb_2O_3$ | 0.1 | 0.1 | 0.1 | 0.1 | 0.1 | 0.1 | 0.1 | 0.1 | 0.1 | 0.1 |
| $SnO_2$ | | | | | | | | | | |
| $Gd_2O_3$ | | | | | | | | | | |
| $(TiO_2 + La_2O_3)/B_2O_3$ | 2.4 | 2.5 | 2.4 | 2.2 | 2.5 | 2.2 | 2.1 | 2.4 | 2.2 | 2.4 |
| Refractive Index nd | 1.69 | 1.69 | 1.68 | 1.68 | 1.69 | 1.67 | 1.67 | 1.68 | 1.67 | 1.68 |
| Strain Point Ts (° C.) | 642 | 640 | 641 | 643 | 643 | 641 | 637 | 641 | 642 | 644 |
| Liquidus Temperature TL (° C.) | 952 | 950 | 956 | 952 | 934 | 969 | 970 | 963 | 907 | 904 |
| Chemical Resistance (µm) | — | — | — | — | — | — | — | — | — | — |
| Inorganic Phosphor | | | | | YAG | | | | | |
| Content of Phosphor Powder (% by volume) | | | | | 10 | | | | | |
| Refractive Index of Glass Matrix | 1.69 | 1.69 | 1.68 | 1.68 | 1.69 | 1.67 | 1.67 | 1.68 | 1.67 | 1.68 |
| Refractive Index of Phosphor Powder | | | | | 1.82 | | | | | |
| Refractive Index Difference between Glass Matrix and Phosphor Powder | 0.13 | 0.13 | 0.14 | 0.14 | 0.13 | 0.15 | 0.15 | 0.14 | 0.15 | 0.14 |
| Firing Temperature (° C.) | 852 | 850 | 856 | 852 | 834 | 869 | 870 | 863 | 807 | 804 |
| Luminous Flux (lm) | 199 | 199 | 202 | 202 | 200 | 199 | 200 | 203 | 200 | 199 |

TABLE 3

|  | 21 | 22 | 23 | 24 | 25 | 26 |
|---|---|---|---|---|---|---|
| $SiO_2$ | 32.2 | 32.2 | 1.6 | 37.6 | 50.0 | 44.0 |
| $Al_2O_3$ | 2.5 | 2.5 | 2.0 | 1.5 | 5.0 | 4.6 |
| $B_2O_3$ | 7.4 | 7.4 | 26.5 | | 6.0 | 5.4 |
| MgO | | | | | | |
| CaO | 2.9 | 2.9 | | 5.9 | 12.0 | |
| SrO | 7.9 | 5.9 | | 4.9 | | |
| BaO | 26.0 | 27.0 | 3.4 | 27.0 | 25.0 | 36.0 |
| ZnO | 1.0 | 2.0 | 25.0 | 3.4 | 2.0 | |
| $TiO_2$ | 6.7 | 6.7 | 1.5 | 9.7 | | |
| $ZrO_2$ | 2.2 | 2.2 | | 3.2 | | |
| $La_2O_3$ | 10.8 | 10.8 | 25.0 | 6.8 | | 10.0 |
| $Sb_2O_3$ | 0.1 | 0.1 | | | | |
| $SnO_2$ | 0.3 | 0.3 | | | | |
| $Gd_2O_3$ | | | 15.0 | | | |
| $(TiO_2 + La_2O_3)/B_2O_3$ | 2.4 | 2.4 | 1.0 | — | | 1.9 |
| Refractive Index nd | 1.68 | 1.68 | 1.71 | 1.7 | 1.51 | 1.56 |

TABLE 3-continued

|  | 21 | 22 | 23 | 24 | 25 | 26 |
|---|---|---|---|---|---|---|
| Strain Point Ts (° C.) | 642 | 638 | 633 | 694 | 634 | 647 |
| Liquidus Temperature TL (° C.) | 918 | 911 | 1048 | 1075 | 1000 | 1000 |
| Chemical Resistance (μm) | — | — | 10 | 0.1 | — | — |
| Inorganic Phosphor | | | | YAG | | |
| Content of Phosphor Powder (% by volume) | | | | 10 | | |
| Refractive Index of Glass Matrix | 1.68 | 1.68 | 1.71 | 1.7 | 1.56 | 1.58 |
| Refractive Index of Phosphor Powder | | | | 1.82 | | |
| Refractive Index Difference between Glass Matrix and Phosphor Powder | 0.14 | 0.14 | 0.11 | 0.12 | 0.26 | 0.24 |
| Firing Temperature (° C.) | 818 | 811 | 948 | 975 | 900 | 900 |
| Luminous Flux (lm) | 202 | 200 | 188 | 160 | 175 | 170 |

(1) Production of Glass Powder

First, raw materials were formulated to give each of the glass compositions shown in Tables 1 to 3, thus obtaining a raw material batch. The obtained raw material batch was fed into a glass melting furnace to melt it at 1300 to 1500° C. Next, the melt was run between a pair of cooling rollers to form it into a film shape. The obtained film-like glass was dry-ground in a ball mill, thus obtaining a glass powder having an average particle diameter $D_{50}$ of 6 to 9 μm. Furthermore, part of the molten glass was run on a carbon plate to form it into a flat plate shape and then subjected to a predetermined annealing treatment, thus obtaining a bulk glass.

The bulk glass was evaluated in terms of each property of refractive index (nd), liquidus temperature (TL), and strain point (Ts) in the following manners. The results are shown in Tables 1 to 3.

The refractive index was measured by using a refractometer KPR-2000 manufactured by Shimadzu Corporation to adopt a value measured in terms of the d-line (with a wavelength of 587.6 nm) of a He lamp.

The strain point was measured in conformity with ASTM C336-71.

The liquidus temperature is the value obtained by passing a glass powder obtained by pulverizing the bulk glass in an agate mortar through a standard sieve of 30 meshes (500-μm mesh size), further sieving the passed glass powder with a 50-mesh (300-μm mesh size) sieve, putting a glass powder left on the 50-mesh sieve into a platinum boat, holding the platinum boat containing the glass powder in a temperature-gradient furnace for 24 hours, and then measuring a temperature at which crystals were precipitated.

(2) Production of Wavelength Conversion Member

As described in Tables 1 to 3, the phosphor powder was mixed with each of the glass powders in a predetermined amount, thus obtaining a powder mixture. The powder mixture was pressed into a shape in a mold to produce a columnar preform having a diameter of 1 cm. The preform was fired at a temperature described in the tables, thus obtaining a wavelength conversion member.

The obtained wavelength conversion member was evaluated in terms of chemical resistance and luminous flux. The results are shown in Tables 1 to 3.

The chemical resistance was evaluated in the following manner. The wavelength conversion member was processed into a 10 mm×50 mm×0.7 mm size, polished to a mirror finish with diamond abrasive grains having a particle diameter of 1 μm, and then immersed into a 50° C. etching liquid (ITO-06N manufactured by Kanto Chemical Co., Inc.) for 15 minutes. After its sintered body was washed with water, a level difference produced between the YAG phosphor powder and the glass matrix was then measured with SURFCORDER ET4000 manufactured by Kosaka Laboratory Ltd., and the measured value was evaluated as the chemical resistance. In the cases where no level difference was produced between the phosphor powder and the glass matrix (i.e., there was no corrosion in the glass matrix), this is indicated by "–" in the tables.

The luminous flux was measured in the following manner. The wavelength conversion member was processed into a disc shape having a diameter of 8 mm and a thickness of 0.2 mm. For the purpose of reducing the effects of surface reflection due to refractive index differences from the light source and the air, the surface of the wavelength conversion member was coated with an antireflection film formed of a dielectric multi-layer film. The wavelength conversion member was disposed above a light source of an LED chip with an excitation wavelength of 460 nm energized by an input current of 1000 mA and a spectral energy distribution of light emitted from the top surface of the sample was measured in an integrating sphere. Next, the obtained spectra were multiplied by the standard spectral luminous efficiency function to calculate a total luminous flux.

In the wavelength conversion members of Nos. 1 to 23 which were working examples, their glass matrices had high refractive indices of 1.66 or more and low liquidus temperatures of 1048° C. or below. Therefore, the wavelength conversion members exhibited high luminous fluxes of 188 (lm) or more. Particularly, the wavelength conversion members of Nos. 1 to 22 also exhibited excellent chemical resistance. In contrast, the wavelength conversion member of No. 24, which was a comparative example, had a high liquidus temperature of 1075° C. and the wavelength conversion members of Nos. 25 and 26, which were comparative examples, had low refractive indices of 1.56 or less. Therefore, these wavelength conversion members exhibited low luminous fluxes of 175 (lm) or less.

INDUSTRIAL APPLICABILITY

The wavelength conversion member according to the present invention is suitable as a wavelength conversion member for use in a general lighting, such as a white LED, or a special lighting (for example, a light source for a projector or a light source for a vehicle headlight).

REFERENCE SIGNS LIST 1 light emitting device
2 wavelength conversion member
3 light source

The invention claimed is:

1. A wavelength conversion member comprising:
a phosphor powder dispersed in a glass matrix, wherein the glass matrix contains, in terms of % by mass, 25% or more of $SiO_2$; and
the glass matrix has a refractive index (nd) of 1.6 or more and a liquidus temperature of 1070° C. or below.

2. The wavelength conversion member according to claim 1, wherein the glass matrix further contains, in terms of % by mass, 0.1 to 8% $Al_2O_3$, over 0 to 15% $B_2O_3$, 0 to 10% MgO, 0 to 15% CaO, 0 to 15% SrO, 0.1 to 50% BaO, 0 to 20% ZnO, 0 to 10% $ZrO_2$, 0 to 5% $Nb_2O_5$, 2.1 to 15% $TiO_2$, and 0.1 to 15% $La_2O_3$ and $(TiO_2+La_2O_3)/B_2O_3$ is 0.5 or more.

3. The wavelength conversion member according to claim 1, wherein a content of $Li_2O+Na_2O+K_2O$ in the glass matrix is 0 to 5%.

4. The wavelength conversion member according to claim 1, wherein a content of $Sb_2O_3$ in the glass matrix is below 0.2%.

5. The wavelength conversion member according to claim 1, wherein the phosphor powder is at least one selected from the group consisting of a nitride phosphor, an oxynitride phosphor, an oxide phosphor, a sulfide phosphor, an oxysulfide phosphor, a halide phosphor, and an aluminate phosphor.

6. The wavelength conversion member according to claim 1, containing the phosphor powder in an amount of 0.01 to 70% by volume.

7. The wavelength conversion member according to claim 1, being made of a sintered body of a mixture containing a glass powder and the phosphor powder.

8. A light emitting device comprising: the wavelength conversion member according to claim 1; and a light source operable to irradiate the wavelength conversion member with excitation light.

9. The wavelength conversion member according to claim 1, wherein a content of the $SiO_2$ in the glass matrix is, in terms of % by mass, 50% or less.

* * * * *